US011335850B2

(12) United States Patent
Yogendra et al.

(10) Patent No.: US 11,335,850 B2
(45) Date of Patent: May 17, 2022

(54) MAGNETORESISTIVE RANDOM-ACCESS MEMORY DEVICE INCLUDING MAGNETIC TUNNEL JUNCTIONS

(71) Applicant: International Business Machines Corporation, Armonk, NY (US)

(72) Inventors: Karthik Yogendra, Albany, NY (US); Robert Robison, Rexford, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 16/816,322

(22) Filed: Mar. 12, 2020

(65) Prior Publication Data

US 2021/0288242 A1 Sep. 16, 2021

(51) Int. Cl.
*H01L 43/08* (2006.01)
*H01L 43/02* (2006.01)
*G11C 11/16* (2006.01)
*H01L 27/22* (2006.01)
*H01L 43/10* (2006.01)
*H01L 43/12* (2006.01)

(52) U.S. Cl.
CPC .......... *H01L 43/08* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ....... H01L 43/08; H01L 27/222; H01L 43/02; H01L 43/10; H01L 43/12; G11C 11/161

USPC ........................................................ 257/421
See application file for complete search history.

(56) References Cited

U.S. PATENT DOCUMENTS

| 6,577,529 | B1 | 6/2003 | Sharma et al. |
| 6,829,161 | B2 | 12/2004 | Huai et al. |
| 7,539,047 | B2 | 5/2009 | Katti |
| 9,047,964 | B2 | 6/2015 | Lee et al. |
| 9,985,199 | B1 | 5/2018 | Briggs et al. |
| 10,714,131 | B1* | 7/2020 | Wu ......... G11B 5/398 |
| 2002/0036331 | A1 | 3/2002 | Nickel et al. |
| 2014/0117477 | A1* | 5/2014 | Park ............ G11C 11/161 257/421 |

(Continued)

OTHER PUBLICATIONS

Ishigaki et al., "A Multi-Level-Cell Spin-Transfer Torque Memory with Series-Stacked Magnetotunnel Junctions," Symposium on VLSI Technology, 2010, 2 pages.

(Continued)

*Primary Examiner* — Jami Valentine Miller
(74) *Attorney, Agent, or Firm* — Jeffrey M. Ingalls

(57) ABSTRACT

A method of manufacturing a double magnetic tunnel junction device is provided. The method includes forming a first free layer, forming a first tunnel barrier layer on the free layer, forming a reference layer on the first tunnel barrier layer, forming a second tunnel barrier layer on the reference layer, and forming a second free layer on the second tunnel barrier layer. An area of the second free layer is less than an area of the first free layer. Also, the first free layer, the first tunnel barrier layer and the reference layer are a first magnetic tunnel junction, and the reference layer, the second tunnel barrier layer and the second free layer are a second magnetic tunnel junction.

20 Claims, 8 Drawing Sheets

(56) References Cited

U.S. PATENT DOCUMENTS

| | | | | |
|---|---|---|---|---|
| 2014/0362624 | A1* | 12/2014 | Yamada | H01L 29/861 |
| | | | | 363/126 |
| 2015/0137289 | A1* | 5/2015 | Khalili Amiri | G11C 11/161 |
| | | | | 257/421 |
| 2016/0240780 | A1 | 8/2016 | Yu | |
| 2021/0111337 | A1* | 4/2021 | Huo | G11C 11/161 |

OTHER PUBLICATIONS

Panagopoulos et al., "Exploring variability and reliability of multi-level STT-MRAM cells," 70th Annual Device Res. Conf. (DRC), 2012, 2 pages.

Sbiaa et al., "Spin transfer torque switching for multi-bit per cell magnetic memory with perpendicular anisotropy," Applied Physics Letters, vol. 99, No. 9, 2011, 092506, 4 pages.

* cited by examiner

MAGNETORESISTIVE RANDOM-ACCESS MEMORY DEVICE INCLUDING MAGNETIC TUNNEL JUNCTIONS

BACKGROUND

The present disclosure relates to magnetoresistive random-access memory (MRAM) device cells including double magnetic tunnel junction (DMTJ) stacks and methods of manufacturing MRAM devices. Tunnel magnetoresistance (TMR) and write efficiency are factors that affect the performance of MRAM devices. Moreover, bit density is one of the parameters driving memory scaling. Beyond a certain level, reducing the pitch of the devices is not an effective way to increase the bit density in the MRAM array. In this regard, a reduced pitch has implications with ion beam etching at higher angles. DMTJ devices address the pitch limits of memory scaling limits and may allow for an increase in the memory density of the MRAM devices.

SUMMARY

Embodiments of the present disclosure relate to a method of manufacturing an MRAM device. The method includes forming a first free layer, forming a first tunnel barrier layer on the free layer, forming a reference layer on the first tunnel barrier layer, forming a second tunnel barrier layer on the reference layer, and forming a second free layer on the second tunnel barrier layer. An area of the second free layer is less than an area of the first free layer. Also, the first free layer, the first tunnel barrier layer and the reference layer are a first magnetic tunnel junction, and the reference layer, the second tunnel barrier layer and the second free layer are a second magnetic tunnel junction.

Other embodiments relate to a magnetic tunnel junction device. The magnetic tunnel junction device includes a first free layer, a first tunnel barrier layer formed on the first free layer, a reference layer formed on the first tunnel barrier layer, a second tunnel barrier layer formed on the reference layer, and a second free layer formed on the second tunnel barrier layer. An area of the second free layer is less than an area of the first free layer. Also, the first free layer, the first tunnel barrier layer and the reference layer are a first magnetic tunnel junction, and the reference layer, the second tunnel barrier layer and the second free layer are a second magnetic tunnel junction.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
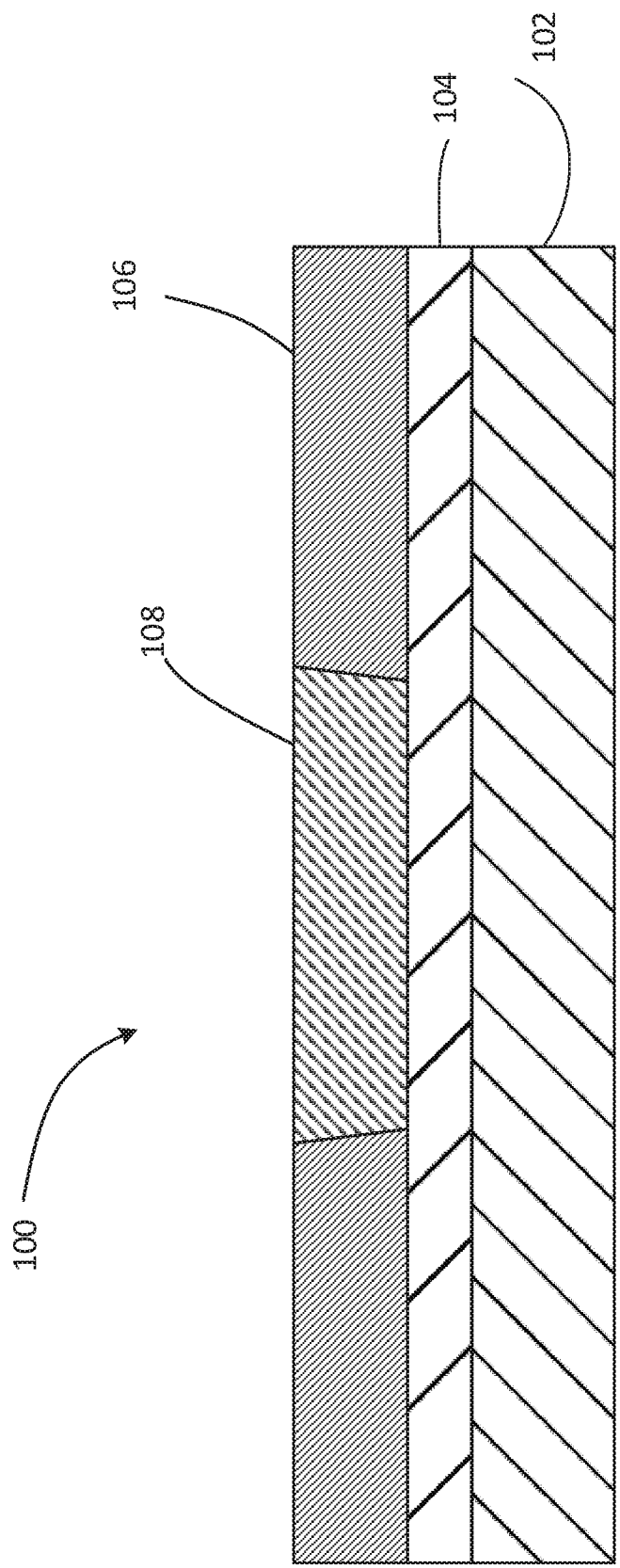
FIG. 1 is a cross-sectional view of certain base layers that are formed underneath a MRAM device, according to embodiments.

The present disclosure describes MRAM devices including double magnetic tunnel junction ("DMTJ") stacks and methods of manufacturing MRAM devices. In particular, the present disclosure describes a 2-bit MRAM device with two magnetic tunnel junctions (MJTs) stacked vertically with a shared reference layer, and where the free layers in the different MJTs have different surface areas.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" and "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy ("MBE") and more recently, atomic layer deposition (ALD) among others. Another deposition technology is plasma enhanced chemical vapor deposition (PECVD), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE) or milling. In general, IBE refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (i.e., a vacuum state) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded dynamic random-access memory ("eDRAM") is a DRAM integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and one possible way to reach MTJ write target speeds comparable to eDRAM (~5 ns) are with double magnetic tunnel junctions ("DMTJ").

In certain DMTJ devices, a wide non-magnetic base modified DMTJ device is used to increase the MTJ's switching efficiency by eliminating both the resistance area ("RA") penalty and magnetoresistance ("MR") penalty that are both associated with standard DMTJs that have top and bottom MTJs with similar critical-dimensions ("CD"). These types of wide based devices provide double spin-current sourcing ("DSTT") benefits. Also, for these types of devices, the bottom barrier layer can have a relatively high RA. Certain of these devices leverage spin-diffusion transport in a non-magnetic ("NM") metal layer that is provided between the two MTJ stacks, and they can a achieve a reduction in the charge current density through the bottom MgO layer. However, in certain of these wide base DMTJ devices, each of the MTJ stacks include a reference layer. The combination of the two separate reference layers, and the intermediate NM layer results in a taller DMTJ stack, which increases the complexity of the manufacturing process and may lead to electrical shorts across the barrier.

The present embodiments include DMJT structures and methods of fabricating DMTJ structures where one of the MTJ stacks has a wider base than the other. In certain of these embodiments, the MRAM device includes a DMTJ structure where a single reference layer is shared between the free layers of the separate MTJ stacks. Thus, there is one less reference layer relative to the DMTJ devices discussed above. Moreover, the device does not include the NM metal spacer between the two MTJ stacks, also discussed above.

The flowcharts and cross-sectional diagrams in the Figures illustrate methods of manufacturing DMTJs according to various embodiments. In some alternative implementations, the manufacturing steps in the flowcharts may occur in a different order than that which is noted in the Figures. Moreover, any of the layers depicted in the Figures may contain multiple sublayers.

Referring now to the drawings in which like numerals represent the same or similar elements and initially to FIG. 1, an exemplary method of manufacturing an MRAM device including a DMTJ stack to which the present embodiments may be applied is shown. FIG. 1 illustrates a cross-sectional view of a starting structure where several front-end-of-line (FEOL) layers 102 are formed (one layer is shown for ease of illustration). FEOL generally refers to every layer up to (but not including) the deposition of metal interconnect layers, and in general the FEOL layers do not include the MTJ stack layers. In certain embodiments, the FEOL layers 102 include transistors. In certain embodiments, a first metal layer 104 is formed on top of the FEOL layers 102. In certain examples, the first metal layer 104 includes contacts and vias (not shown).

As shown in FIG. 1, a first electrode layer including a via dielectric layer 106 and a first electrode 108 is formed on the metal layer 104. Initially, the via dielectric layer 106 may be formed by patterning via lithography. Then, a via is formed in the via dielectric layer 106 by, for example, RIE to remove a space for subsequent filling with the first electrode 108. In certain embodiments, the first electrode 108 may include a material such as W, Cu, TaN, Ta, Ti, TiN, TiOCN, TaOCN, or a combination of these materials. The first electrode 108 can be formed by CVD, PVD, ALD or a combination thereof. After the first electrode 108 is formed, the structure is subjected to, for example, CMP to planarize the surface for further processing. In this example, the FEOL layers 102, the first metal layer 104 and the first electrode layer including the via dielectric layer 106 and the first electrode 108 comprise a starting structure upon which the DMTJ stack is later formed. It should be appreciated that other layers may be included or omitted in this starting structure, and any layer may have multiple sublayers.

Figure 2:
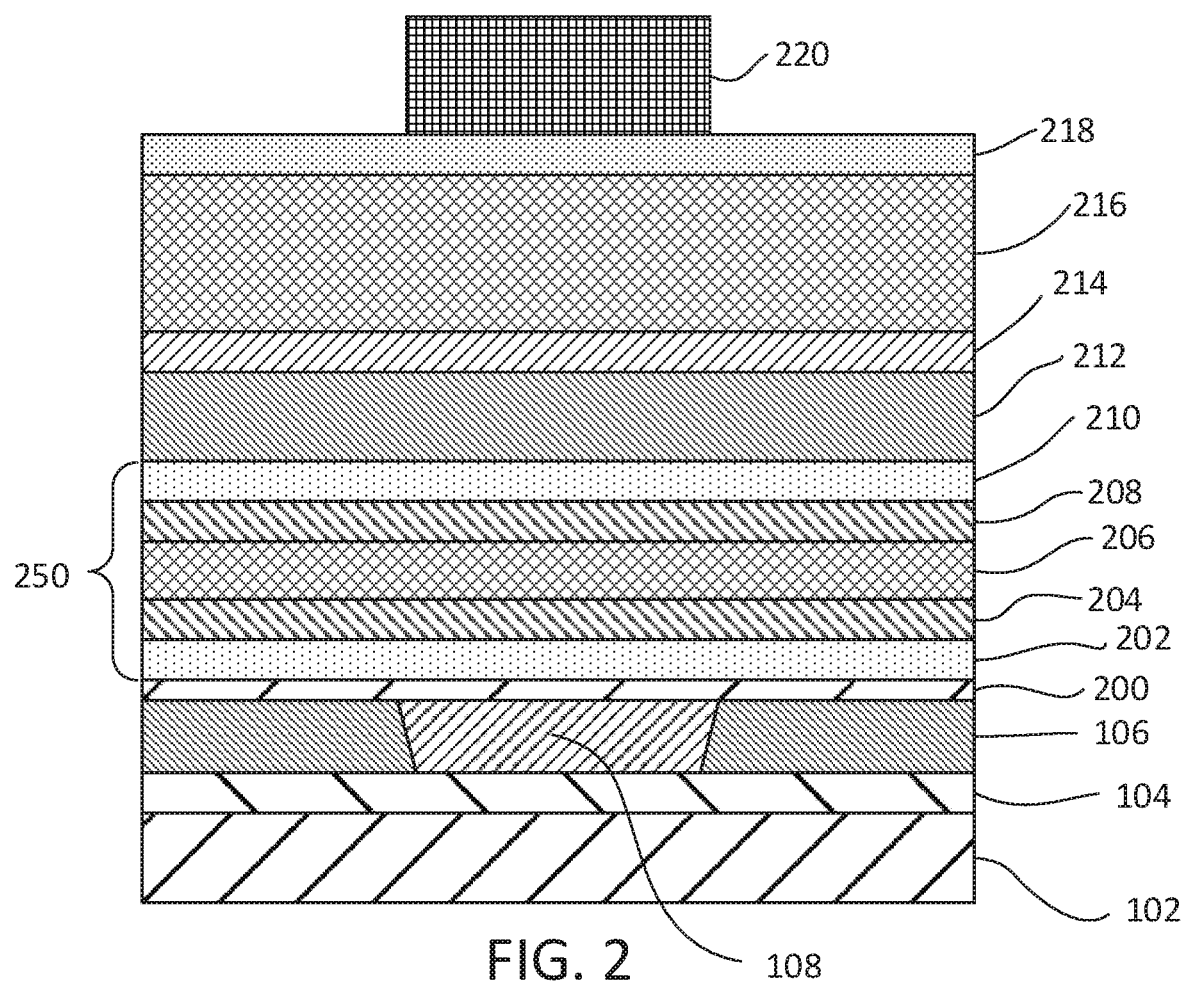
FIG. 2 depicts a cross-sectional view of the MRAM device of FIG. 1 after additional fabrication operations, according to embodiments.

Referring now to FIG. 2, a seed layer 200 is formed on the electrode layer 106. The seed layer 200 has a crystal lattice and grain structure that is suitable as a growth surface for the free layer. The seed layer 200 can be a metal seed layer composed of Ru, Ta, NiCr or a combination of these materials, for example.

Figure 8:
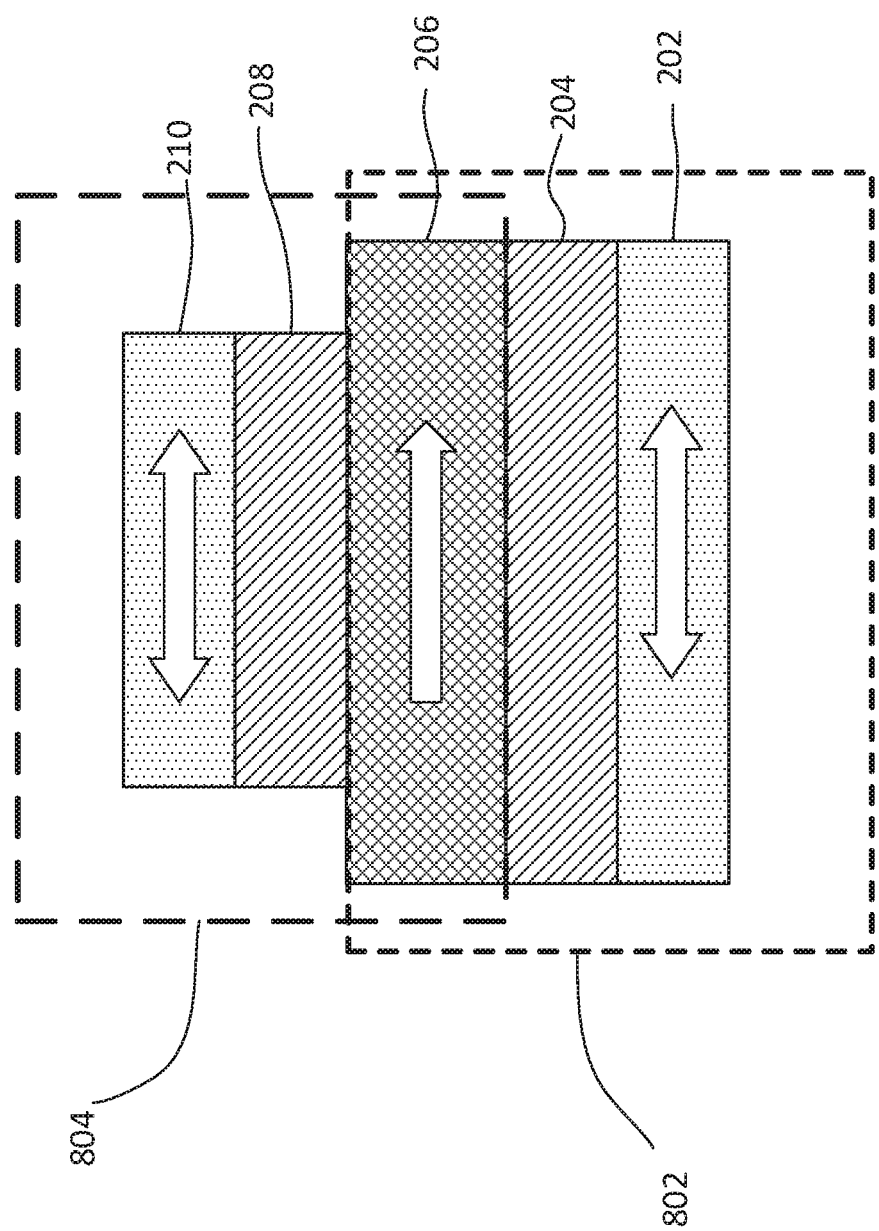
FIG. 8 depicts a cross-sectional view of the DMTJ stack of the MRAM device of FIG. 7, according to embodiments.

In certain embodiments, as shown in FIG. 2, the DMTJ structure 250 includes a first free layer 202, a first tunnel barrier layer 204, a reference layer 206, a second tunnel barrier layer 208, and a second free layer 210. The single reference layer 206 is thus shared between the first free layer 202 and the second free layer 210. In particular, as discussed in further detail below with respect to FIG. 8, a first MTJ stack 802 (see also, FIG. 8) includes the first free layer 202, the first tunnel barrier layer 204 and the reference layer 206, and the boundary of this first MTJ stack 802 is shown schematically by a dashed bounding box. As also shown in FIG. 8, a second MTJ stack 804 includes the reference layer 206, the second tunnel barrier layer 208, and the second free layer 210, and the boundary of this second MTJ stack 804 is shown schematically by another dashed bounding box. Thus, the reference layer 206 is shared by the first and second MTJ stacks 802 and 804. It should be appreciated that the MRAM device including the DMTJ stack may include additional layers, omit certain layers, and each of the layers may include sublayers, provided that a single reference layer is shared between the two MTJ stacks.

Referring again to FIG. 2, in general, the first free layer 202 and the second free layer 210 are magnetic free layers that are adjacent to the first tunnel barrier layer 204 and the second tunnel barrier layer 208, respectively, so as to be opposed to the shared reference layer 206. In general, the magnetic free layers have a magnetic moment or magnetization that can be flipped. In certain embodiments, the first tunnel barrier layer 204 and the second tunnel barrier layer 208 are a barrier, such as a thin insulating layer or electric potential, between two electrically conducting materials. Electrons (or quasiparticles) pass through the tunnel barrier by the process of quantum tunneling. In certain embodiments, each of the first tunnel barrier 204 and the second tunnel barrier layer 208 includes at least one sublayer composed of MgO.

In certain embodiments, each layer of the MRAM material stack may have a thickness less than an angstrom to a thickness of several angstroms or nanometers. Examples of typical materials in the MRAM material stack can include MgO for the first and second tunnel barrier layers 202 and 208, CoFeB for the first and second free layers 202 and 210, and a plurality of layers comprised of different materials in reference layer 206. It should be appreciated that the MRAM material stack is not limited to these materials or to the layers depicted in FIG. 2. That is, the MRAM material stack can be composed of any known stack of materials used in MRAM devices. Moreover, it should be appreciated that either of the MTJ stacks may include additional layers, omit certain layers, and each of the layers may include any number of sublayers. Moreover, the composition of layers and/or sublayers may be different between the first MTJ stack 802 and the second MTJ stack 804 (see, FIG. 8).

Referring back to FIG. 2, several additional layers are initially formed on the DMTJ stack. In certain embodiments, a second electrode 212 is formed on the second free layer 210. A dielectric hardmask 214 is formed on the second electrode 212. In one example, TaN is used for the dielectric hardmask 214. Then, an organic planarization layer 216 is formed on the dielectric hard mask 214. A silicon containing anti-reflective coating layer 218 ("SiARC") is then formed on the planarization layer 216. Finally, a resist layer 220 is patterned on the SiARC layer 218. In certain embodiments, the resist layer 220 is patterned in locations generally corresponding to the first electrode 108.

Figure 3:
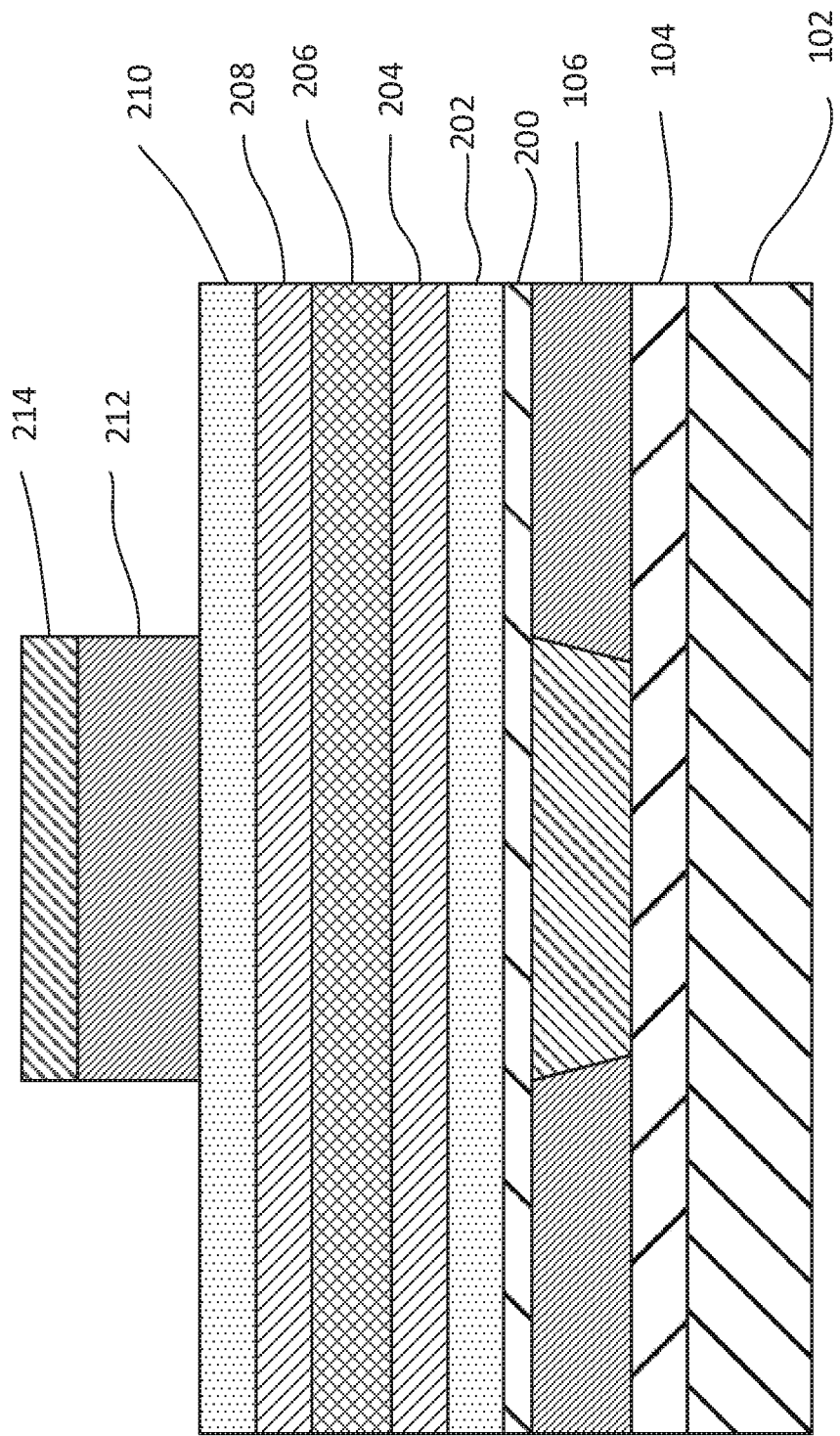
FIG. 3 depicts a cross-sectional view of the MRAM device of FIG. 2 after additional fabrication operations, according to embodiments.

Referring now to FIG. 3, the DMTJ stack 250 is patterned by IBE or RIE (or some combination of same). This etching process is stopped at the second free layer 210. As shown in FIG. 3, the planarization layer 216, the SiARC layer 218 and the resist layer 220 are completely removed at this stage of the manufacturing process, leaving portions of the dielectric hardmask 214 and the second electrode 212.

Figure 4:
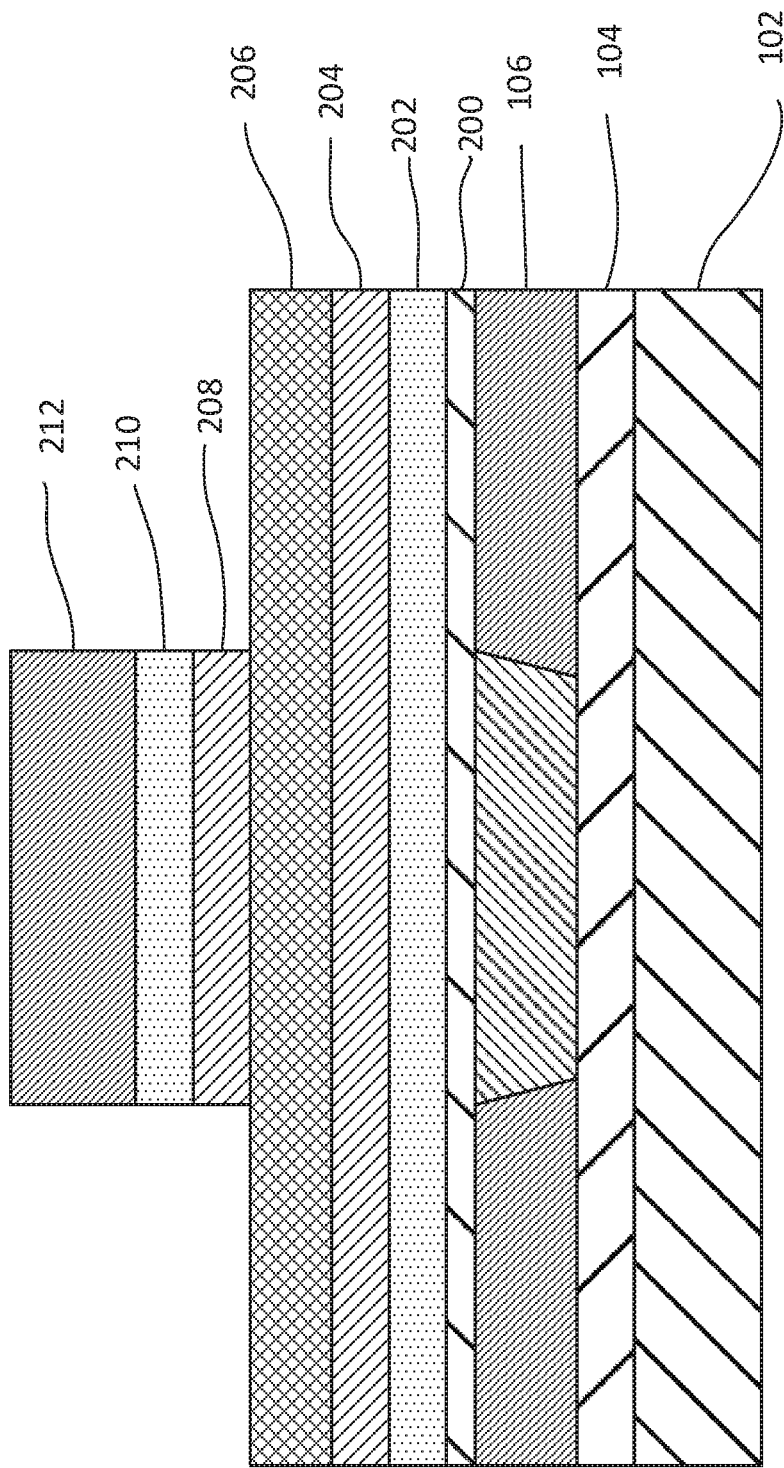
FIG. 4 depicts a cross-sectional view of the MRAM device of FIG. 3 after additional fabrication operations, according to embodiments.

Referring now to FIG. 4, IBE or another suitable etching process is performed using the dielectric hardmask 214 as a pattern, and the etching process is stopped at the level of the reference layer 206. Thus, the second free layer 210, the second electrode 212 and the second tunnel barrier layer 208 have generally the same width as the dielectric hardmask 214. In a subsequent processing step, the dielectric hardmask 214 is removed, as shown in FIG. 4.

Figure 5:
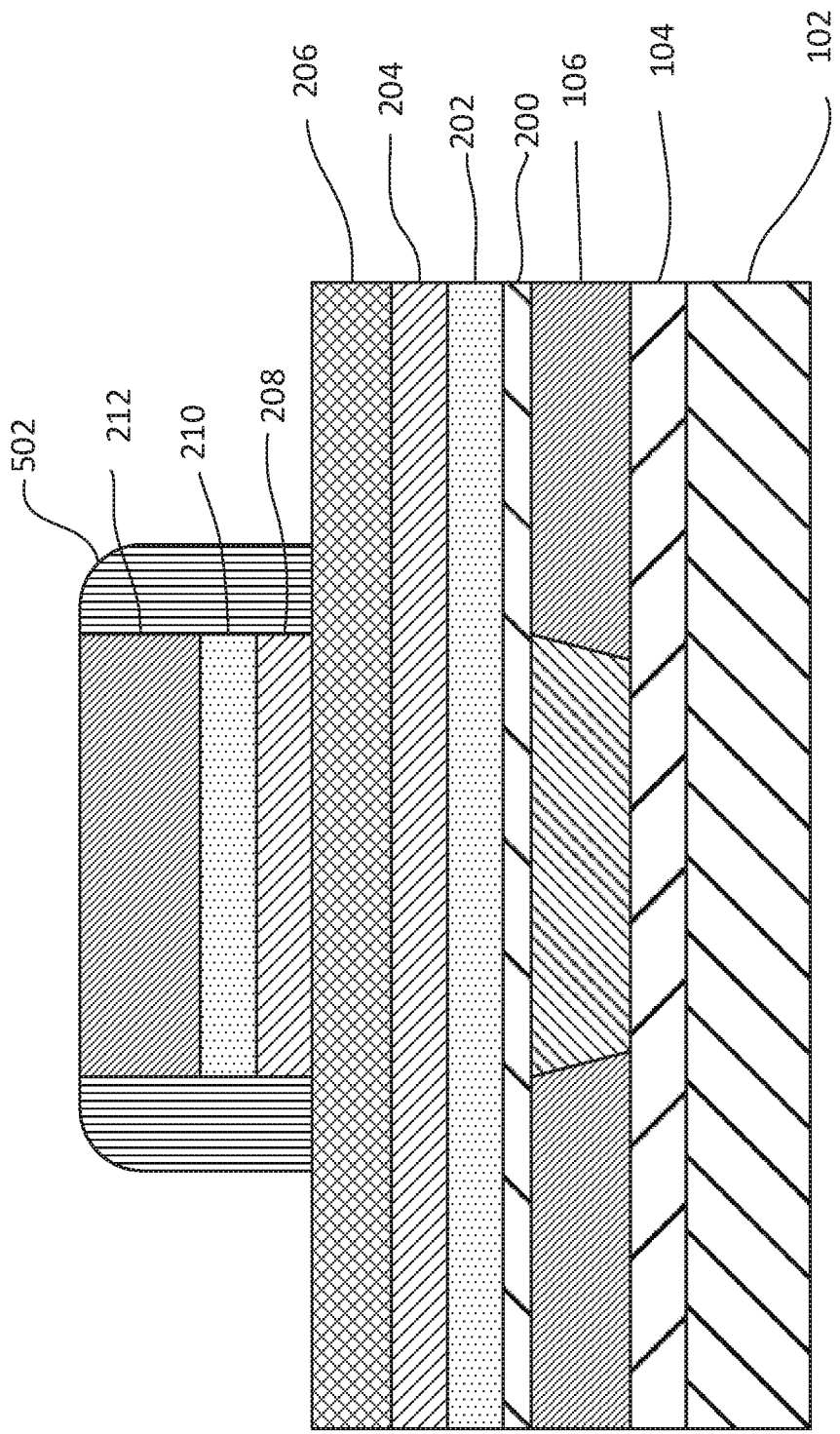
FIG. 5 depicts a cross-sectional view of the MRAM device of FIG. 4 after additional fabrication operations, according to embodiments.

Referring now to FIG. 5, a first encapsulation dielectric layer 502 is formed by, for example, PVD, ALD or PECVD. The first encapsulation dielectric layer 502 may be composed of, for example, $AlO_x$, $TiO_x$, $SiO_x$, BN, SiN or SiBCN. In certain embodiments, prior to the formation of the first encapsulation dielectric layer 502, the exposed structure can be subjected to an optional plasma pretreatment using, for example, $O_2$, $H_2$, $N_2$ or $NH_3$. As shown in FIG. 5, there is a certain width to the first encapsulation dielectric layer 502.

Figure 6:
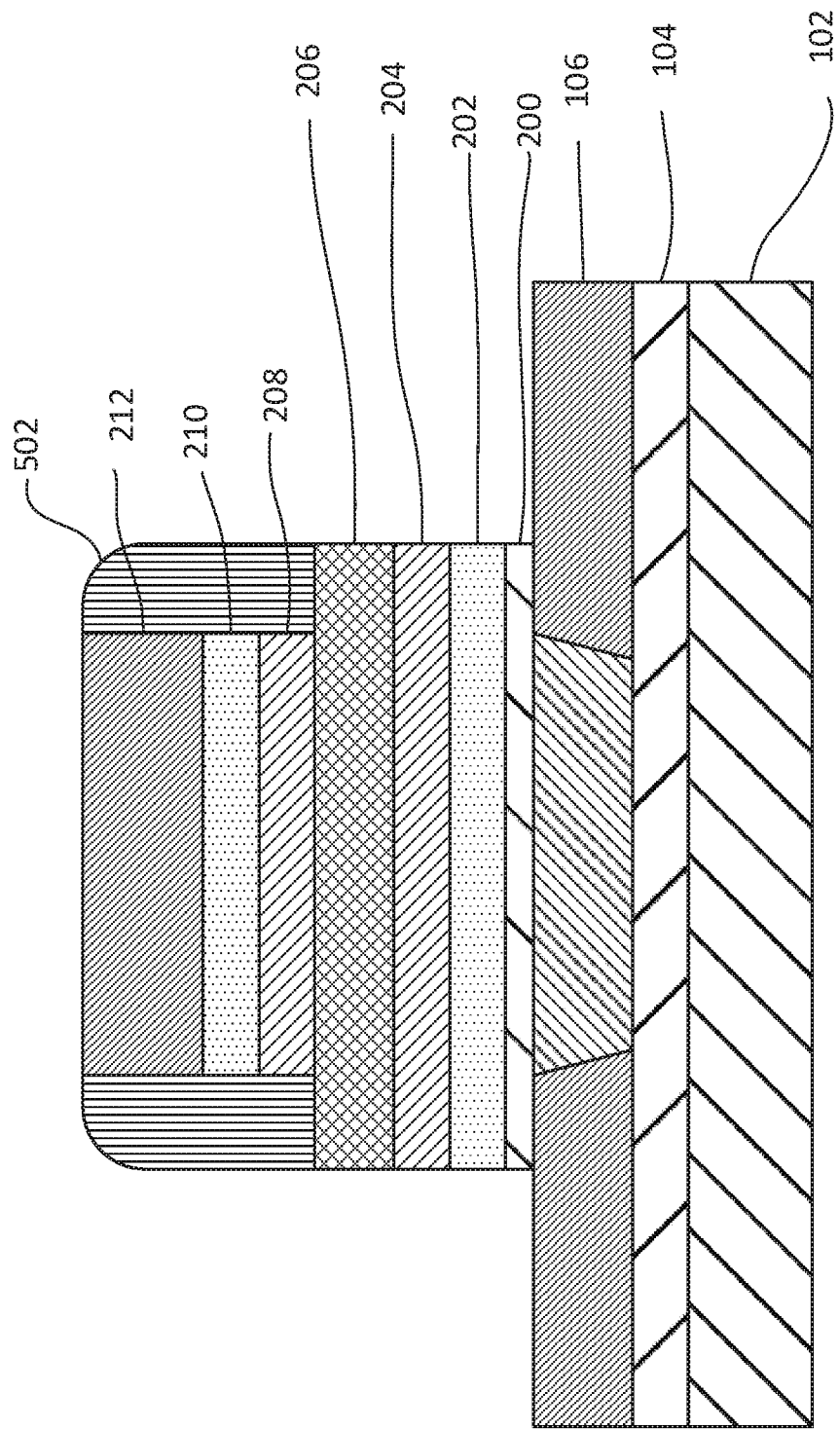
FIG. 6 depicts a cross-sectional view of the MRAM device of FIG. 5 after additional fabrication operations, according to embodiments.

Referring now to FIG. 6, IBE is performed on the remaining DMTJ stack with the first encapsulation dielectric layer 502 functioning as a hardmask during the etching operation. In particular, the etching process is stopped at the level of the via dielectric layer 106. Because the first encapsulation dielectric layer 502 has a certain width and functions as the hardmask, the remaining portions of the shared reference layer 206, the first tunnel barrier layer 204 and the first free layer 202 are wider than the second electrode 212, the second free layer 210 and the second tunnel barrier layer 208. Thus, the first free layer 202 and the second free layer 210 have different areas or critical dimensions (CDs), and therefore have different switching currents.

Figure 7:
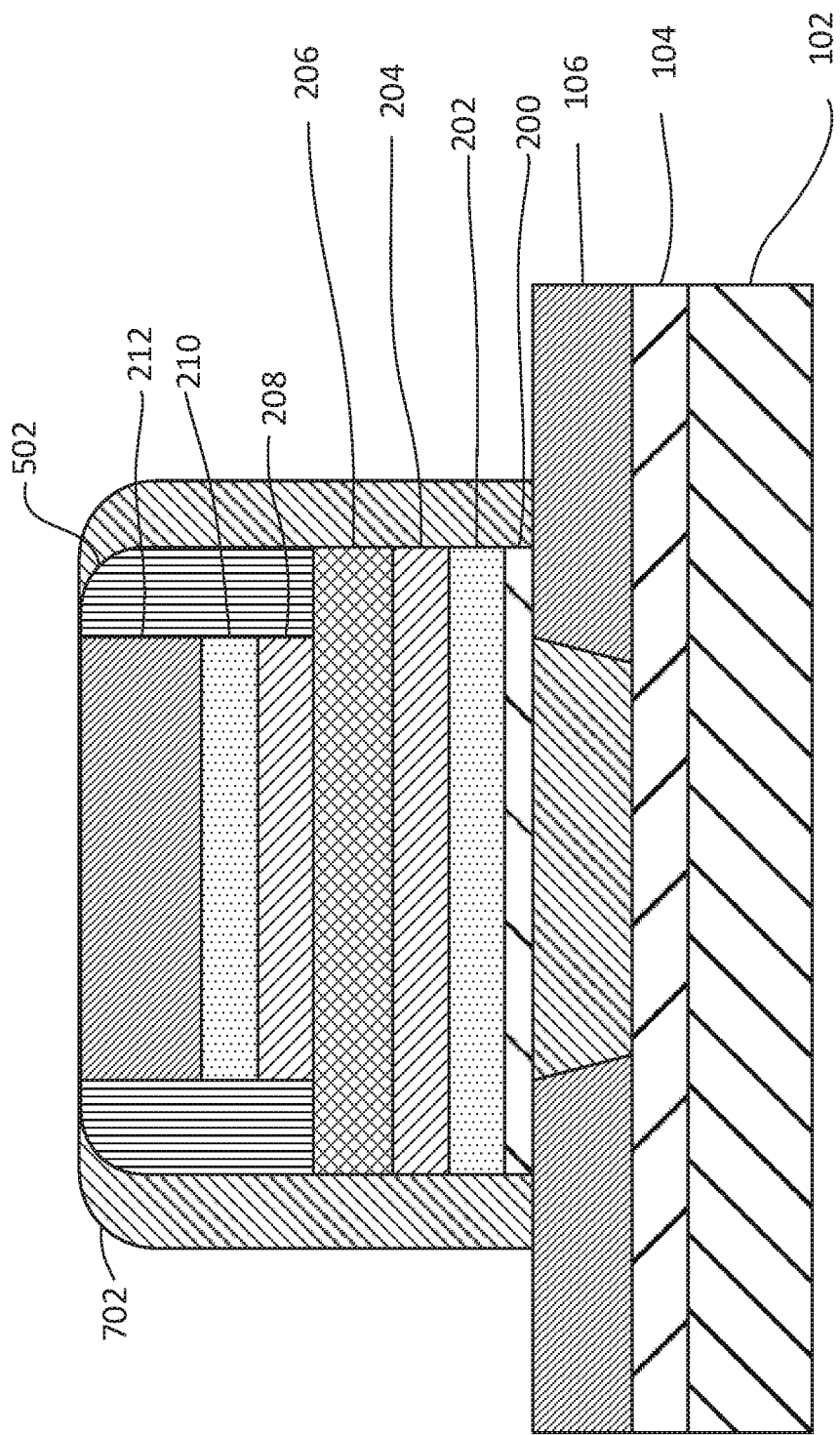
FIG. 7 depicts a cross-sectional view of the MRAM device of FIG. 6 after additional fabrication operations, according to embodiments.

Referring now to FIG. 7, a second encapsulation dielectric layer 702 is formed by, for example, PVD, ALD or PECVD to cover the sidewalls of the reference layer 206, the first tunnel barrier layer 204, the first free layer 202 and the seed layer. The second encapsulation dielectric layer 702 may be composed of, for example, $AlO_x$, $TiO_x$, $SiO_x$, BN, SiN or SiBCN. The material of the second encapsulation dielectric layer 702 may be the same as, or different to, the material of the first encapsulation dielectric layer 502. Thus, two MTJ stacks are vertically stacker one over another such that they are electrically connected in series with only two electrical contacts.

Referring now to FIG. 8, this figure illustrates how the reference layer 206 is effectively shared between two different MTJ stacks. As discussed briefly above, a first MTJ stack 802 includes the first free layer 202, the first tunnel barrier layer 204 and the reference layer 206, and the boundary of this first MTJ stack 802 is shown schematically by a dashed bounding box. Also as shown in FIG. 8, a second MTJ stack 804 includes the reference layer 206, the second tunnel barrier layer 208, and the second free layer 210, and the boundary of this second MTJ stack 804 is shown schematically by another dashed bounding box. Thus, the reference layer 206 is shared by the first and second MTJ stacks 802 and 804. This structure is an example of a 2-bit MRAM device according to certain embodiments.

In general, with regard to the MTJ stacks, information is stored in the magnetic orientation of a free layer film (described in further detail herein) in relation to that of the reference layer. The reference layer may be a single layer or a plurality of layers. In an embodiment, the reference layer of the MTJ stack is a synthetic antiferromagnetic ("SAF") layer. In certain embodiments, the reference layer of the MTJ stack includes a plurality of sublayers (e.g., twenty or more sublayers).

The magnetic anisotropy can be either in-plane ("IMA") or perpendicular-to-plane (PMA). Table 1 below summarizes the parallel and antiparallel states that exist for the 2-bit MRAM device, where "0" represents a parallel (P) state and "1" represents an antiparallel (AP) state.

TABLE 1

| FIRST MTJ | SECOND MTJ | STATE |
| --- | --- | --- |
| P | P | 00 |
| P | AP | 01 |
| AP | P | 10 |
| AP | AP | 11 |

The first free layer 202 and the second free layer 210 have switching currents of Ic1 and Ic2, respectively, due to the different areas (i.e., width, critical dimension, diameter etc.) of the layers. In particular, the first free layer 202 has a higher switching current Ic1 that the switching current Ic2 of the second free layer 210. When a current of Ic2 is applied to the MRAM device, the state (i.e., parallel or antiparallel) switches for the second free layer 210, but the state does not switch for the first free layer 202. When a current of Ic1 is applied, the state switched for both the first free layer 202 and the second free layer 210. The second free layer 210 may be switched back using Ic2 if only the first free layer 202 is required to be programmed.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a double magnetic tunnel junction device, the method comprising:
   forming a first free layer;
   forming a first tunnel barrier layer on the free layer;
   forming a reference layer on the first tunnel barrier layer;
   forming a second tunnel barrier layer on the reference layer; and
   forming a second free layer on the second tunnel barrier layer,
   wherein a width of the second free layer is less than a width of the first free layer,
   wherein the first free layer, the first tunnel barrier layer and the reference layer have the same width and are a first magnetic tunnel junction, and
   wherein the reference layer, the second tunnel barrier layer and the second free layer are a second magnetic tunnel junction.

2. The method according to claim 1, wherein the first and second magnetic tunnel junctions are formed vertically over one another and are electrically connected in series with two electrical contacts.

3. The method according to claim 2, wherein after forming the second free layer, the method further comprises:
   forming an electrode on the second free layer; and
   removing portions of the electrode, the second free layer, and the second tunnel barrier to form a second magnetic tunnel junction stack structure.

4. The method according to claim 3, further comprising:
   forming a first dielectric encapsulation layer on sidewalls of the second magnetic tunnel junction stack structure.

5. The method according to claim 4, further comprising:
   removing portions of the reference layer, the first free layer, and the first tunnel barrier layer not covered by the first dielectric encapsulation layer to form a first magnetic tunnel junction stack structure,
   wherein an area of the first magnetic tunnel junction stack structure is greater than an area of the second magnetic tunnel junction stack structure.

6. The method according to claim 5, further comprising forming a second dielectric encapsulation layer on sidewalls of the first dielectric encapsulation layer and the first magnetic tunnel junction stack structure.

7. The method according to claim 1, wherein the first free layer has a smaller switching current than that of the second free layer.

8. The method according to claim 1, wherein the magnetic anisotropy of the double magnetic tunnel junction device is in-plane.

9. The method according to claim 1, wherein the magnetic anisotropy of the double magnetic tunnel junction device is perpendicular-to-plane.

10. The method according to claim 1, wherein the reference layer is formed in direct contact with the first and second tunnel barrier layers.

11. A double magnetic tunnel junction device comprising:
a first free layer;
a first tunnel barrier layer formed on the first free layer;
a reference layer formed on the first tunnel barrier layer;
a second tunnel barrier layer formed on the reference layer; and
a second free layer formed on the second tunnel barrier layer,
wherein a width of the second free layer is less than a width of the first free layer,
wherein the first free layer, the first tunnel barrier layer and the reference layer have the same width and are a first magnetic tunnel junction, and
wherein the reference layer, the second tunnel barrier layer and the second free layer are a second magnetic tunnel junction.

12. The double magnetic tunnel junction device according to claim 11, wherein the first and second magnetic tunnel junctions are stacked vertically over one another and are electrically connected in series with two electrical contacts.

13. The double magnetic tunnel junction device according to claim 11, further comprising an electrode formed on the second free layer.

14. The double magnetic tunnel junction device according to claim 13, further comprising a first dielectric encapsulation layer formed on sidewalls of the electrode, the second free layer, and the second tunnel barrier layer.

15. The double magnetic tunnel junction device according to claim 14, further comprising a second dielectric encapsulation layer formed on sidewalls of the first dielectric encapsulation layer, the reference layer, the first tunnel barrier layer, and the first free layer.

16. The double magnetic tunnel junction device according to claim 11, wherein the second free layer has a lower switching current than that of the first free layer.

17. The double magnetic tunnel junction device according to claim 11, wherein the magnetic anisotropy of the double magnetic tunnel junction device is in-plane.

18. The double magnetic tunnel junction device according to claim 11, wherein the magnetic anisotropy of the double magnetic tunnel junction device is perpendicular-to-plane.

19. The double magnetic tunnel junction device according to claim 11, wherein the reference layer is formed in direct contact with the first and second tunnel barrier layers.

20. The double magnetic tunnel junction device according to claim 15, wherein the first dielectric encapsulation layer and the second dielectric encapsulation layer comprise at least one material selected from the group consisting of $AlO_x$, $TiO_x$, $SiO_x$, BN, SiN, and SiBCN.

* * * * *